(12) United States Patent
Bourgeois et al.

(10) Patent No.: US 10,700,254 B2
(45) Date of Patent: Jun. 30, 2020

(54) THERMOELECTRIC DEVICE

(71) Applicant: CENTRE NATIONAL DE LA RECHERCHE SCIENTIFIQUE, Paris (FR)

(72) Inventors: Olivier Bourgeois, Saint Laurent du Pont (FR); Dimitri Tainoff, Grenoble (FR); Daniel Bourgault, Paris (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 15/998,951

(22) PCT Filed: Feb. 13, 2017

(86) PCT No.: PCT/FR2017/050324
§ 371 (c)(1),
(2) Date: Aug. 17, 2018

(87) PCT Pub. No.: WO2017/140975
PCT Pub. Date: Aug. 24, 2017

(65) Prior Publication Data
US 2019/0326499 A1 Oct. 24, 2019

(30) Foreign Application Priority Data
Feb. 18, 2016 (FR) .................................... 16 51336

(51) Int. Cl.
*H01L 35/32* (2006.01)
*G01J 5/02* (2006.01)
(Continued)

(52) U.S. Cl.
CPC ............ *H01L 35/325* (2013.01); *G01J 5/023* (2013.01); *G01J 5/12* (2013.01); *H01L 27/16* (2013.01); *H01L 35/16* (2013.01); *H01L 35/32* (2013.01)

(58) Field of Classification Search
CPC ....... H01L 35/325; H01L 35/32; H01L 35/16; H01L 27/16; G01J 5/12; G01J 5/023
See application file for complete search history.

(56) References Cited

U.S. PATENT DOCUMENTS

| 6,046,398 A | 4/2000 | Foote et al. |
| 2005/0087221 A1* | 4/2005 | Shah ..................... F24F 5/0042 136/205 |

(Continued)

FOREIGN PATENT DOCUMENTS

| EP | 1 976 034 | 10/2008 |
| EP | 2 887 033 | 6/2015 |
| JP | 2000-077729 | 3/2000 |

OTHER PUBLICATIONS

International Search Report, PCT/FR2017/050324, dated Mar. 31, 2017.

(Continued)

*Primary Examiner* — Galina G Yushina
(74) *Attorney, Agent, or Firm* — Young & Thompson (57) ABSTRACT

Disclosed is a thermoelectric cell having thermoelectric tracks of alternating conductivity types connected in series by metallic connections, including a platform suspended over a substrate by arms, the platform and the arms being parts of the same thermally and electrically insulating layer, and each arm supporting a thermoelectric track.

20 Claims, 6 Drawing Sheets

(51) Int. Cl.
  *G01J 5/12*  (2006.01)
  *H01L 27/16*  (2006.01)
  *H01L 35/16*  (2006.01)

(56) References Cited

U.S. PATENT DOCUMENTS

| | | | | |
|---|---|---|---|---|
| 2006/0151021 A1* | 7/2006 | Stark | ............... | H01L 35/32 |
| | | | | 136/205 |
| 2007/0112467 A1* | 5/2007 | Sumrall | ............... | B25J 7/00 |
| | | | | 700/260 |
| 2015/0177070 A1* | 6/2015 | Maes | ............... | G01J 5/023 |
| | | | | 374/121 |
| 2015/0355017 A1* | 12/2015 | Clarke | ............... | G01J 1/42 |
| | | | | 702/104 |
| 2016/0049571 A1* | 2/2016 | Thuss | ............... | H01L 35/34 |
| | | | | 438/54 |
| 2016/0079306 A1* | 3/2016 | Kropelnicki | ............... | H01L 27/16 |
| | | | | 257/467 |
| 2016/0231178 A1* | 8/2016 | Herrmann | ............... | G01J 5/12 |

OTHER PUBLICATIONS

French Search Report, FR 1651336, dated Nov. 7, 2016.
Perez-Martin et al., "Micrpower Thermoelectric Generator From Thin Si Membranes", Nano Energy (2014) 4, 73-80.

* cited by examiner

THERMOELECTRIC DEVICE

The present patent application claims the priority of the French patent application FR16/51336 which shall be considered as an integral part of the present description.

TECHNICAL FIELD OF THE INVENTION

The present application relates to thermoelectric devices, and in particular, to a device comprising alternating n-type and p-type thermoelectric materials connected in series by metallic connections.

PRESENTATION OF THE PRIOR ART

Figure 1A:
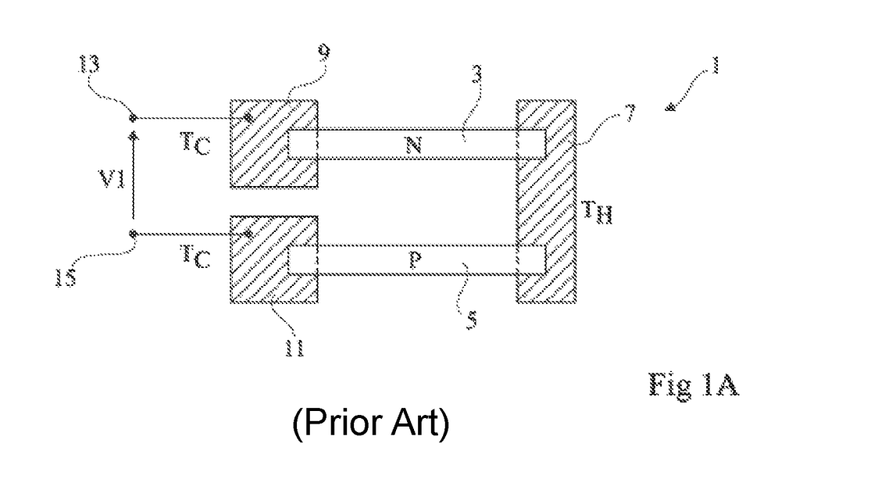
FIGS. 1A and 1B represent thermoelectric devices having thermoelectric tracks of alternating types connected in series by metallic connections.

FIG. 1A represents a thermoelectric device 1 having alternating n-type and p-type thermoelectric tracks connected in series by metallic connections. The device comprises an n-doped semiconductor strip 3 and a p-doped semiconductor strip 5. These strips constitute thermoelectric tracks. Tracks 3 and 5 are electrically connected in series by metallic connection 7 between two metallic contacts 9 and 11 equipped with terminals 13 and 15.

In one mode of operation, contacts 9 and 11 are at a temperature $T_C$ and the metallic connection 7 is at a temperature $T_H$ greater than temperature $T_C$. A voltage V1 then appears between terminals 13 and 15. The thermoelectric device 1 can then be used as a source of current or voltage (thermopile) to power a self-contained electronic circuit. The device can also be used to detect the difference between the temperature of the contacts and that of the metallic connection.

In another mode of operation, terminals 13 and 15 are connected to a power source, and the flow of electric current in tracks 3 and 5 produces a difference between the temperature of the contacts and that of metallic connection 7. Thermoelectric device 1 can then be used as a Peltier cooler.

The voltage produced by device 1 used as a thermopile at a given temperature difference between temperatures $T_H$ and $T_C$ depends on the nature of the material used for the tracks. The thermoelectric sensitivity or Seebeck coefficient (in V/° C.) of the material of a track is defined by the voltage which appears between the ends of the track for a given temperature difference between the ends. To increase the current and/or voltage produced, i.e. to increase the device's performance, we seek to increase the Seebeck coefficient and to reduce both the electrical resistance of the tracks and the thermal conduction between metallic connection 7 and contacts 9 and 11.

Figure 1B:
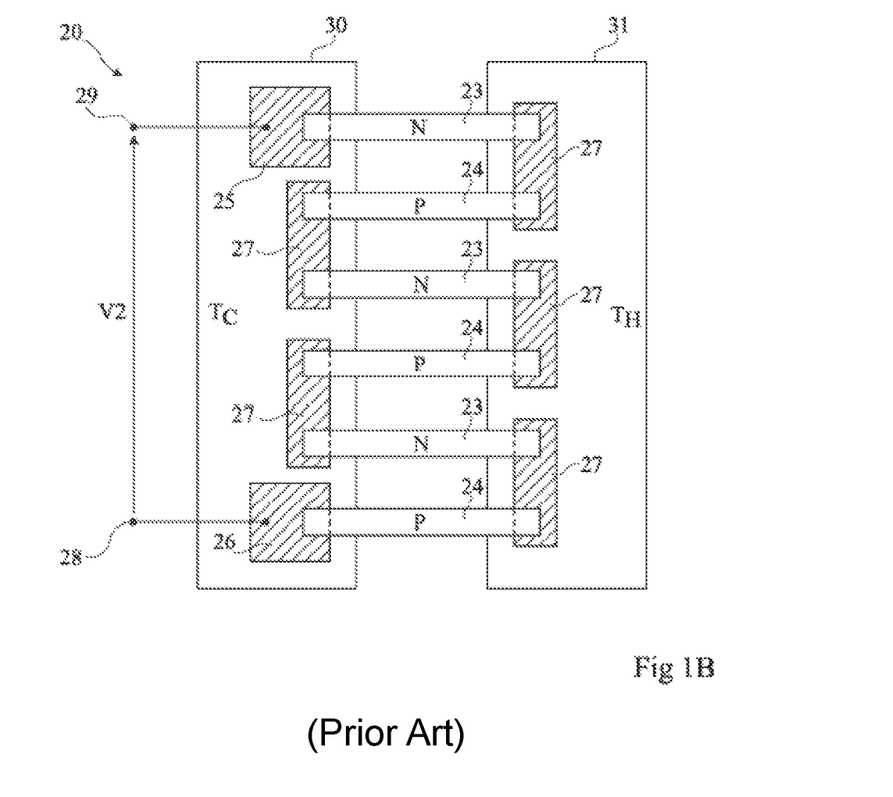

FIG. 1B represents a thermoelectric device 20 having alternating n-type and p-type thermoelectric tracks 23 and 24 connected in series between two metallic contacts 25 and 26 by metallic connections 27. Contacts 25 and 26 are equipped with terminals 28 and 29. The metallic connections 27 that alternate between tracks are alternately in thermal contact with a bloc 30 at temperature $T_C$ and a block 31 at temperature $T_H$. A voltage V2, related to the number of tracks in series, is produced between terminals 28 and 29 as a function of the difference between temperatures $T_H$ and $T_C$.

In general, in a thermoelectric device having thermoelectric tracks of alternating types connected in series by metallic connections, a chain of tracks connects two metallic contacts in series. Each track in the chain connects two metallic elements, e.g. a contact and a metallic connection, and the metallic elements are alternately in thermal contact with two different blocks.

Various structures have been proposed for thermoelectric devices. The article by A. P. Perez-Marin et al., "Micropower thermoelectric generator from thin Si membranes", published in NanoEnergy (2014) 4, 73, 80, describes a thermoelectric device in which one of the two blocks consists of a suspended platform. The tracks are made of doped silicon, alternating between n-type and p-type. This structure, like other known structures, presents various robustness and performance problems.

One would like to have robust thermoelectric devices with improved performance.

SUMMARY

Therefore, a purpose of one embodiment of the invention is to overcome all or some of the disadvantages described above.

Therefore, one embodiment of the invention includes a thermoelectric cell having thermoelectric tracks of alternating types connected in series by metallic connections, comprising a platform suspended over a substrate by arms, the platform and the arms being parts of the same thermally and electrically insulating layer, and each arm supporting a thermoelectric track.

In one embodiment of the invention, the cell comprises a first two metallic contacts located on the substrate and at least two sets of thermoelectric tracks, each of the sets comprising thermoelectric tracks of alternating types connected in series between the first two metallic contacts.

In one embodiment of the invention, the thermoelectric tracks are made of doped bismuth telluride, the alternating types corresponding to types of conductivity.

In one embodiment of the invention, the insulating layer is made of silicon oxide, silicon nitride or aluminium oxide.

In one embodiment of the invention, the ratio between a length and a width of each arm is greater than 5.

In one embodiment of the invention, the platform has a rectangular shape, with two arms extending from one side of the rectangle and two arms extending from the opposite side, and thermoelectric tracks of the same type being positioned on arms located on the same side of the rectangle.

In one embodiment of the invention, the cell also includes an absorbent coating placed on the platform.

One embodiment of the invention includes a thermoelectric device comprising a number of thermoelectric cells arranged in a matrix and having a common substrate, the thermoelectric cells of each column of the matrix being connected in series between the second metallic contacts.

One embodiment of the invention includes a thermopile comprising a thermoelectric device.

In one embodiment of the invention, the platforms are covered with an absorbent material designed to absorb solar radiation, the common substrate being designed to be in thermal contact with a cold source.

In one embodiment of the invention, the platforms are under vacuum.

In one embodiment of the invention, the platforms are in contact with the surrounding air, the common substrate being designed to be in thermal contact with a heat source.

One embodiment of the invention includes a bolometer comprising a thermoelectric device, the device being connected to a sensing circuit, the platforms of the device being covered with a coating that absorbs a selected wavelength, the common substrate being designed to be in thermal contact with a cold source.

One embodiment of the invention includes a cooler comprising a thermoelectric cell or a thermoelectric device.

One embodiment of the invention incorporates a process for manufacturing a thermoelectric cell from a substrate covered with a thermally and electrically insulating layer, comprising the following steps: a) define a region of the insulating layer extended by arms; b) form thermoelectric tracks of alternating types connected in series by metallic connections, each track covering one of the arms; c) etch openings in the insulating layer in such a way as to delineate the defined region and the arms; and d) remove the parts of the substrate located under the defined region and under the arms.

BRIEF DESCRIPTION OF THE DRAWINGS

These characteristics and advantages, as well as others, will be presented in detail in the following description of particular embodiments of the invention, which does not limit the scope of the invention, in connection with the attached figures, among which:

FIGS. 4A to 7A, 4B to 7B, 6C and 7C illustrate the steps of an embodiment of a process for manufacturing a thermoelectric device.

DETAILED DESCRIPTION

The same elements have been designated with the same references in the various figures, and in addition, the various figures are not drawn to scale. For the sake of clarity, only those elements that are useful to understanding the described embodiments have been represented and are detailed. In the following description, terms designating relative position such as the terms "over", "on" and "under" are to be understood as referring to the orientation of the element in question in the cross-sectional views in question.

Figure 2A:
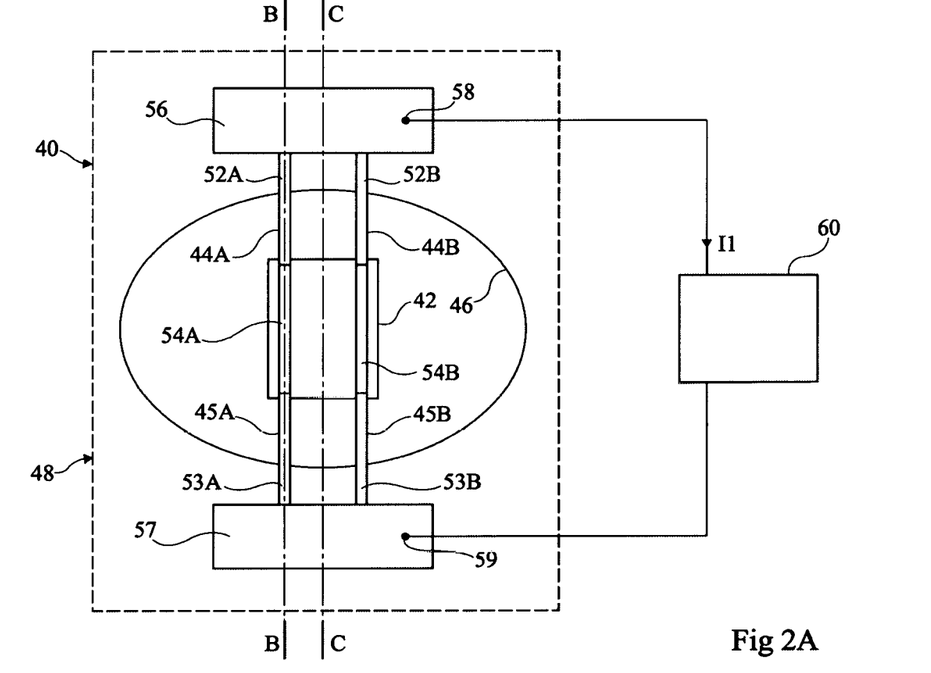
FIGS. 2A to 2C schematically illustrate an embodiment of a thermoelectric device.
Figure 2B:
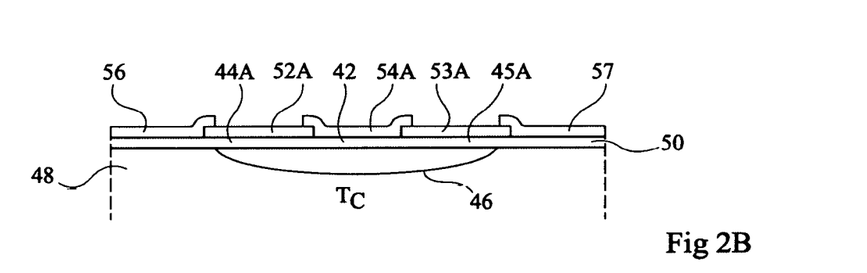
Figure 2C:
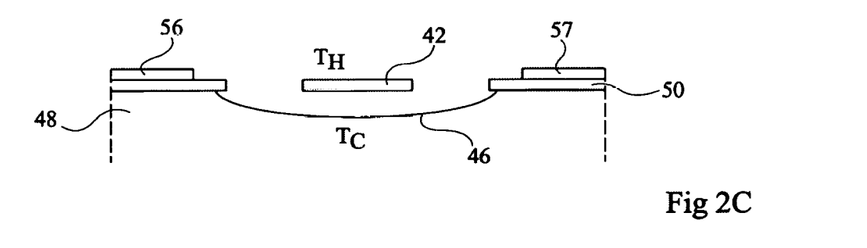

FIGS. 2A to 2C schematically illustrate an embodiment of a thermoelectric device 40. FIG. 2A is a top view and FIGS. 2B and 2C are cross-sectional views along the parallel planes B-B and C-C.

Device 40 comprises a rectangular platform 42 suspended by four arms 44A, 44B, 45A and 45B over a cavity 46 located in one face of a substrate 48. Arms 44A and 44B extend from one side of platform 42 and are in line with arms 45A and 45B which extend from the opposite side of the platform. The arms and platform 42 are portions of the same insulating layer 50 which also covers the parts of substrate 48 surrounding cavity 46. The material of insulating layer 50 is a thermal insulator, i.e. its thermal conductivity is less than 5 $W \cdot m^{-1} \cdot K^{-1}$, and it is also an electrical insulator.

Each of the arms supports a thermoelectric track. Arms 44A and 44B support thermoelectric tracks 52A and 52B of a first type. Arms 45A and 45B support thermoelectric tracks 53A and 53B of a second type. Tracks 52A and 53A are aligned with one another and are connected by a metallic connection 54A located on the platform. Tracks 52B and 53B are connected by a metallic connection 54B located on the platform. Metallic contacts 56 and 57 are located on the substrate covered with insulating layer 50 on either side of cavity 46, contact 56 being in contact with tracks 52A and 52B and contact 57 being in contact with tracks 53A and 53B. Thus, tracks 52A and 53A are of alternating types and are connected in series with contacts 56 and 57 by metallic connection 54A. Tracks 52B and 53B are connected in series in a similar manner between metallic contacts 56 and 57. Layer 50 electrically insulates the contacts from the substrate, but is sufficiently thin as to place the contacts and the substrate in thermal contact.

In one mode of operation of device 40, substrate 48 of the device is maintained at a temperature $T_C$. The platform is brought to a temperature $T_H$, different from $T_C$. Metallic contacts 56 and 57 are coupled by means of contacts 58 and 59 to a load circuit of current I1 originating from contacts 56 and 57 and generated by device 40.

In device 40, each of the tracks 52A, 52B, 53A and 53B is mechanically supported by an arm. The mechanical strength of the structure is provided by the arms, since the mechanical characteristics of the tracks alone might be insufficient to support the platform in a robust manner.

Thus, the choice of material for the tracks can advantageously be made independently of the mechanical properties of that material. For example, one might choose to make the tracks of a material like bismuth telluride, the electrical conductivity, thermal resistivity and thermoelectric sensitivity of that material being optimal at the ambient temperature. In the case of tracks made of bismuth telluride, the tracks of the first type are n-doped, e.g. with selenium, and the tracks of the second type are p-doped, e.g. with antimony. In general, one can use any material for the tracks if the electrical conductivity, thermal resistivity and Seebeck coefficient are appropriate for the operating temperatures of the device.

Platform 42 being suspended, thermal leaks between the platform and substrate 48 are essentially by way of the arms and the tracks. The arms are made of a thermally insulating material and the tracks are very thin. As a result, the difference between temperatures $T_H$ and $T_C$ is almost entirely between the ends of the tracks, which allows device 40 to achieve particularly high performance.

Note that device 40 comprises two chains of thermoelectric tracks, 52A and 53A on one side and 52B and 53B on the other side. The contacts are connected in parallel by the two chains, and as a result, the resistance presented to the passage of a current is weak, which makes it possible to obtain a high current. In addition, in the event that a track in one of the chains should become damaged, the other chain of tracks remains functional and the device can still provide a current.

As an example, substrate 48 is made of silicon. The tracks may have a thickness ranging from 50 to 500 nm. Insulating layer 50 may be made of silicon nitride, silicon dioxide or aluminium oxide, for example. Insulating layer 50 may have a thickness ranging from 100 to 300 nm. As an example, the sides of the platform have dimensions ranging from 5 to 200 μm. As an example, the small sides of the arms, or width of the arms, may range from 0.5 to 3 μm. The ratio of the large side of the arms, or length of the arms, and the width of the arms may be greater than 5. As an example, metallic connections 54A and 54B and metallic contacts 56 and 57 are made of nickel, palladium or titanium gold. As an example, the metallic connections and the metallic contacts have a thickness ranging from 50 to 500 nm. This thickness depends on the thickness of the thermoelectric layers.

Figure 3:
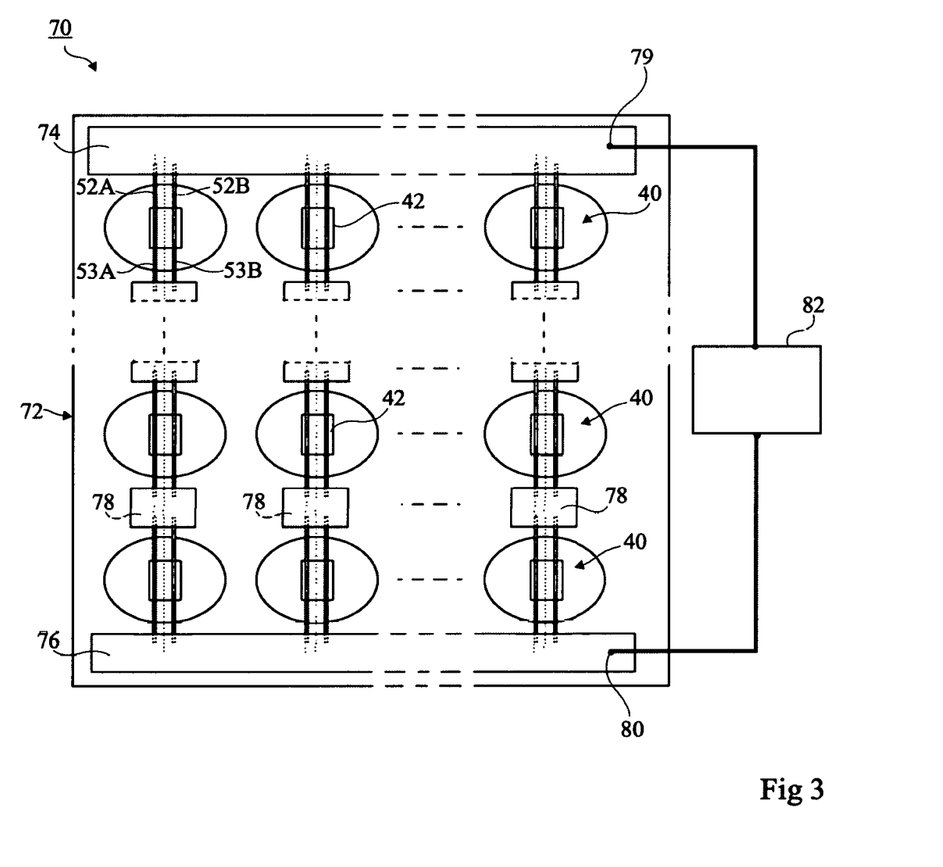
FIG. 3 is a schematic top view of an embodiment of a thermoelectric device.

FIG. 3 is a schematic top view of one embodiment of a thermoelectric device 70 even more robust than the one previously described, and having even greater performance.

Thermoelectric device 70 comprises a set of thermoelectric cells 40, each of which is a device of the type described in relation with FIGS. 2A to 2C. Cells 40 are formed on a common substrate 72 and arranged in a matrix between two elongated metallic contacts 74 and 76. Cells 40 are oriented in such a way that tracks 52A and 52B of each cell extend from platform 42 toward elongated contact 74. The cells of each column are connected in series by contacts 78. The columns in parallel electrically connect contacts 74 and 76.

In one embodiment of the invention, contacts 74 and 76 of the device are coupled by contacts 79 and 80 to a regulator circuit 82. Platforms 42 and substrate 72 are subject to different temperatures $T_C$ and $T_H$.

In the event that one cell of device 70 is deteriorated, only the column containing the defective cell may no longer be able to provide a current. The other columns continue to function normally. Thus, device 70 is resistant to failure.

In a variant, contacts 78 belonging to different columns and located at the same distance from elongated contacts 74 and 76 are connected to one another. Thus, in the event that one cell of the device according to this variant is deteriorated, the other cells continue to function normally and the device is thus particularly resistant to failure.

During operation, the currents produced by the columns are added together. As a result, device 70 produces a high current. In each column, the voltages provided by the cells are added together. Thus, according to an important advantage, the voltage produced by device 70 can be adjusted through the choice of the number of cells in each column, and the current produced by the device can be adjusted by the choice of the number of columns. Thus, the impedance of the device can be adjusted much more easily than with a traditional structure.

As an example, a matrix occupying a surface area of 1 cm$^2$ can contain between 20 and 500 columns, for example, 300 columns. Each column can contain between 10 and 300 cells, for example, 20 cells.

In one mode of operation of device 70, platforms 42 are covered with a material such as a black resin able to absorb radiation, such as solar radiation. Substrate 72 is placed on a base maintained at a temperature $T_C$ by a cold source. As an example, we connect a battery of a self-contained electronic device to regulator circuit 82. The face of device 70 where platforms 42 are located is placed in the sun. An increase in the temperature of platforms 42 relative to the temperature of the base causes a flow of current. The device thus constitutes a thermopile that can charge the battery. Optical concentrators can be placed over the platforms in order to increase the warming of the platforms and to obtain a stronger current. In addition, the platforms can be placed under vacuum, i.e. placed in an environment in which residual gases are at a reduced pressure, allowing for the reduction of thermal transfers.

In another mode of operation, device 70 is placed on a base maintained at a temperature $T_H$ by a heat source and regulator circuit 82 is connected to a battery. Platforms 42 are in contact with a flow of surrounding air, e.g. induced by natural convection. A reduction in the temperature of platforms 42 relative to the temperature of the base induces a current that can charge the battery.

In another mode of operation, device 70 is placed on a base maintained at a temperature $T_C$ by a cold source and regulator circuit 82 is replaced by a circuit to detect the current produced by the device. Platforms 42 are covered with a material that absorbs a selected wavelength, e.g. infra-red radiation. The resulting assembly then constitutes a bolometer: When the platforms are exposed to infra-red radiation, the radiation is absorbed by the material and the temperature of the platforms rises. Note that a single cell 40 can be sufficient to obtain a bolometer, and such cells 40 arranged in a matrix can then be used as an infra-red detector having spatial resolution.

In a mode of operation for detecting the presence of a gas, identical first and second devices 70 are placed on a cooled platform facing a source of optical radiation. The platforms of the first device 70 are covered with a coating able to selectively absorb the optical radiation, and the platforms of the second device absorb less of the optical radiation. The wavelength of the optical radiation corresponds to an absorption line of the gas. The contacts of the devices are connected to a circuit which compares the voltages or currents produced by the two devices. The comparator circuit thus detects the presence of the gas.

Figure 4A:
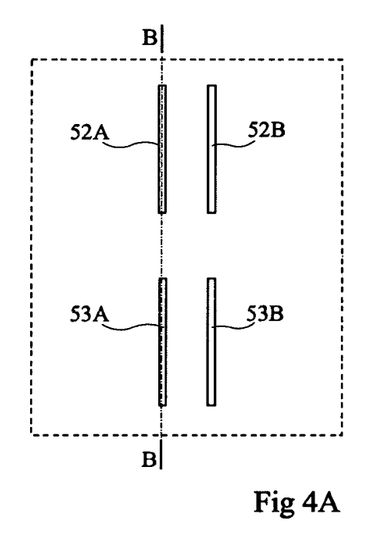
Figure 4B:
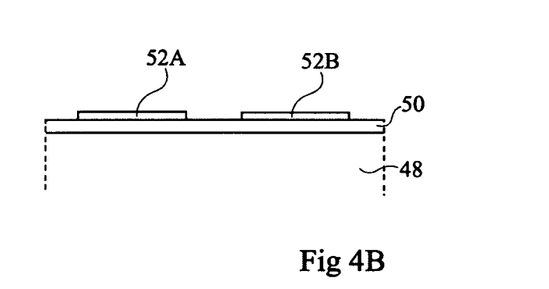
Figure 5A:
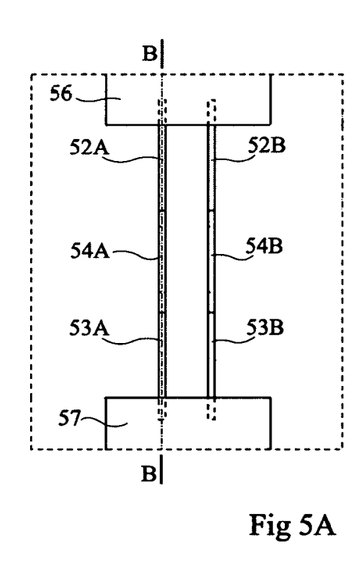
Figure 5B:
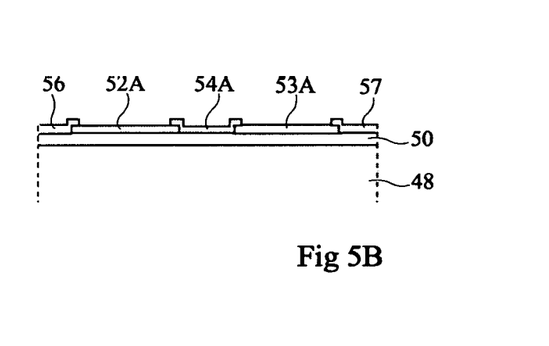
Figure 6A:
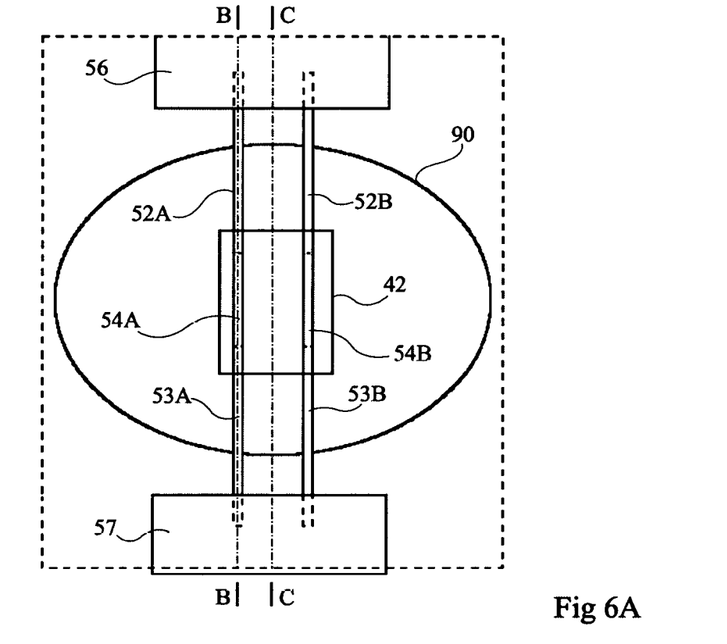
Figure 6B:
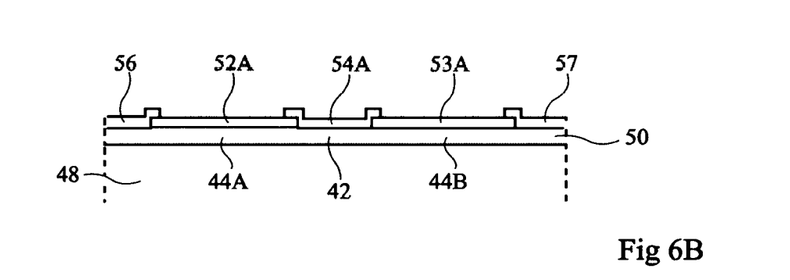
Figure 6C:
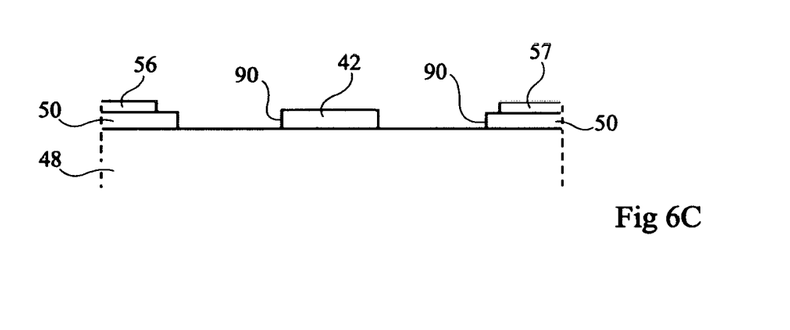
Figure 7A:
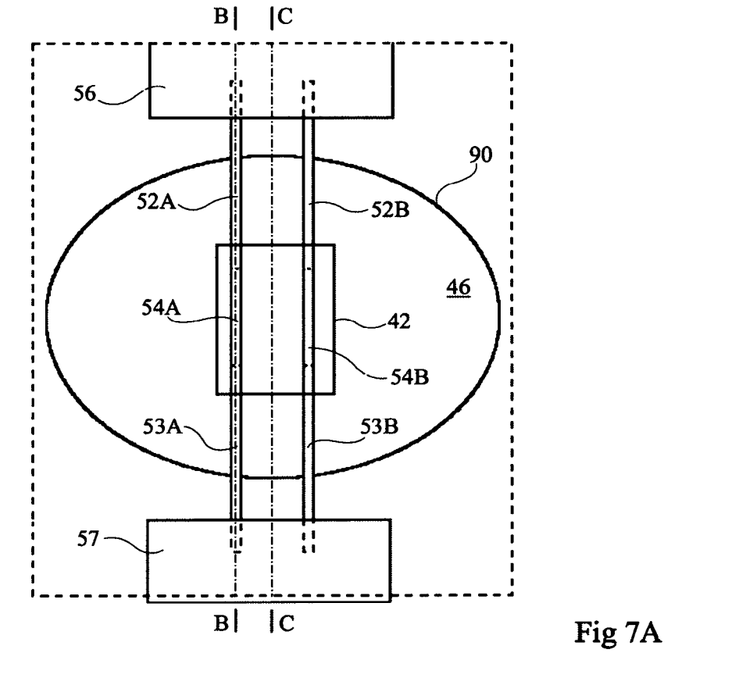
Figure 7B:
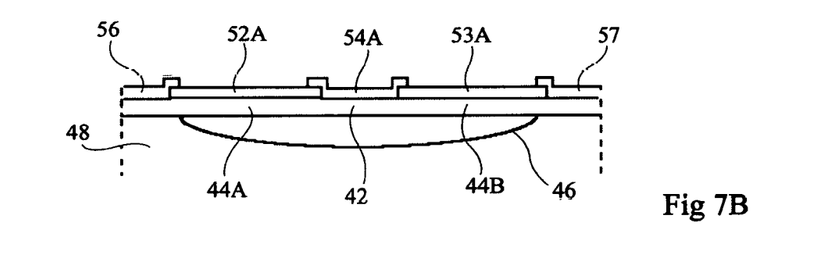
Figure 7C:
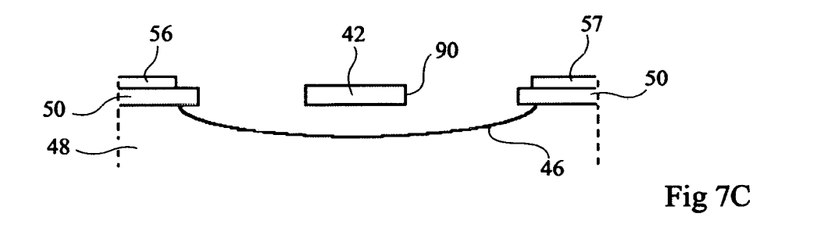

FIGS. 4A to 7A, 4B to 7B, 6C and 7C illustrate the steps of an embodiment of a process for manufacturing a thermoelectric cell 40. FIGS. 4A to 7A are schematic top views, FIGS. 4B to 7B are schematic cross-sectional views along a plane B-B and FIGS. 6C and 7C are schematic cross-sectional views along a plane C-C.

At the step illustrated in FIGS. 4A and 4B, four tracks 52A, 52B, 53A and 53B have been formed in an identical arrangement and from identical materials as those of the four tracks of device 40. The tracks extend on the surface of an insulating layer 50 of silicon nitride covering a silicon substrate 48. As an example, the tracks are produced by a technique such as the one known as the "lift-off" technique. The entire structure, if necessary, is subjected to annealing.

At the step illustrated in FIGS. 5A and 5B, metallic connections 54A and 54B are formed which connect the tracks into two sets of two tracks in series. A metallic contact 56 is formed on the end of tracks 52A and 52B, and another metallic contact 57 is placed on the ends of tracks 53A and 53B.

At the step illustrated in FIGS. 6A to 6C, openings 90 have been etched in insulating layer 50. Openings 90 delimit a platform 42 and arms 44A, 44B, 45A and 45B from insulating layer 50 placed under tracks 52A, 52B, 53A and 53B and connected to the platform. As an example, openings 90 are etched by a sulphur hexafluoride plasma through a mask (not represented).

At the step illustrated in FIGS. 7A to 7C, the portions of the substrate located under the arms and under platform 42 are removed starting from openings 90 to form a cavity 46. These portions of the substrate can be removed by gas-phase isotropic etching. As an example, the silicon substrate is etched by xenon difluoride.

Particular embodiments of the invention have been described. A variety of variants and modifications will be apparent to the person skilled in the art. In particular, although in the embodiments of the invention described above, each platform is suspended by four arms, each platform can be suspended by any even number of arms. What is important is that each arm support a track and that tracks of alternating types be connected in series between two metallic contacts by metallic connections. In this way, each track connects two metallic elements, one being located on the platform and the other being located on the substrate. The metallic elements are thus alternately located on the platform and on the substrate.

Although, in the described embodiments of the invention, cell 40 includes two chains of tracks connected in series between metallic contacts, other embodiments of the invention can contain any other different number of chains of tracks connected in series between the contacts.

Although, in the described embodiments of the invention, the platform of cell 40 has a rectangular shape, other shapes are possible, for example a circular shape.

Although, in the described embodiments of the invention, the platform and the arms of cells 40 are made of silicon nitride, silicon dioxide or aluminium oxide, the platform and the arms can be made of any other thermally and electrically insulating material.

Although, in the described embodiments of the invention, cell 40 is formed on a silicon substrate, the substrate can be made of any other material having a thermal conductivity sufficient to ensure that when the platform and the substrate are at different temperatures, the difference between these temperatures is almost entirely between the platform and the metallic elements located on the substrate.

The invention claimed is:

1. A thermoelectric cell comprising:
   thermoelectric tracks of alternating conductivity types connected in series by metallic connections;
   a platform suspended over a substrate by arms, the platform and the arms being parts of the same thermally and electrically insulating layer, each arm supporting a thermoelectric track so that some of the arms support thermoelectric tracks of a first conductivity type N, and others of the arms support thermoelectric tracks of a second conductivity type P; and
   two first metallic contacts located on the substrate covered with an insulating layer on either side of a cavity, one of the first metallic contacts being in contact with the tracks of the first conductivity type N and another one of the first metallic contacts being in contact with the tracks of the second conductivity type P.

2. The cell as defined in claim 1, wherein the thermoelectric tracks are made of doped bismuth telluride of appropriate conductivity type.

3. The cell as defined in claim 1, wherein the insulating layer is made of silicon oxide, silicon nitride or aluminum oxide.

4. The cell as defined in claim 1, wherein the ratio between a length and a width of each of the arms is greater than 5.

5. The cell as defined in claim 1, wherein the platform is coated with an absorbent.

6. A thermoelectric device comprising:
   a plurality of thermoelectric cells including platforms as defined by the thermoelectric cell of claim 1, arranged in a matrix and having a common substrate, the thermoelectric cells of each column of the matrix being connected in series between second metallic contacts.

7. A thermopile comprising:
   the thermoelectric device of claim 6.

8. The thermopile as defined in claim 7, wherein the platforms of the thermoelectric cells are coated with an absorbent material configured to absorb solar radiation, the common substrate being configured to be in thermal contact with a cold source.

9. The thermopile as defined in claim 8, wherein the platforms of the thermoelectric cells of under vacuum.

10. The thermopile as defined in claim 7, wherein the platforms of the thermoelectric cells are in contact with the surrounding air, the common substrate being configured to be in thermal contact with a heat source.

11. A bolometer comprising:
    the thermoelectric device of claim 6, the device being connected to a sensing circuit, the platforms of the thermoelectric cells of the thermoelectric device being coated with an absorber that absorbs a radiation of a selected wavelength, the common substrate being configured to be in thermal contact with a cold source.

12. A cooler comprising:
    the thermoelectric cell as defined in claim 1.

13. The cell as defined in claim 2, wherein the insulating layer is made of silicon oxide, silicon nitride or aluminum oxide.

14. The cell as defined in claim 2, wherein the ratio between a length and a width of each of the arms is greater than 5.

15. The cell as defined in claim 3, wherein the ratio between a length and a width of each of the arms is greater than 5.

16. The cell as defined in claim 13, wherein the ratio between a length and a width of each of the arms is greater than 5.

17. The cell as defined in claim 2, wherein the platform is coated with an absorbent.

18. The cell as defined in claim 3, wherein the platform is coated with an absorbent.

19. The cell as defined in claim 4, wherein the platform is coated with an absorbent.

20. A thermoelectric device comprising:
    a plurality of thermoelectric cells as defined in claim 2, arranged in a matrix and having a common substrate, the thermoelectric cells of each column of the matrix being connected in series between second metallic contacts.

* * * * *